United States Patent
Goldman

(10) Patent No.: US 7,331,178 B2
(45) Date of Patent: Feb. 19, 2008

(54) HYBRID GENERATION WITH ALTERNATIVE FUEL SOURCES

(75) Inventor: Arnold J. Goldman, Jerusalem (IL)

(73) Assignee: Los Angeles Advisory Services Inc, Napa, CA (US)

(*) Notice: Subject to any disclaimer, the term of this patent is extended or adjusted under 35 U.S.C. 154(b) by 0 days.

(21) Appl. No.: 11/142,848

(22) Filed: May 31, 2005

(65) Prior Publication Data
US 2005/0279095 A1    Dec. 22, 2005

Related U.S. Application Data

(63) Continuation-in-part of application No. 10/760,915, filed on Jan. 20, 2004, now Pat. No. 7,191,736.

(60) Provisional application No. 60/611,825, filed on Sep. 21, 2004, provisional application No. 60/584,653, filed on Jul. 1, 2004, provisional application No. 60/575,641, filed on May 28, 2004, provisional application No. 60/575,225, filed on May 28, 2004, provisional application No. 60/575,759, filed on May 28, 2004, provisional application No. 60/575,300, filed on May 28, 2004, provisional application No. 60/575,301, filed on May 28, 2004, provisional application No. 60/441,088, filed on Jan. 21, 2003.

(51) Int. Cl.
*F03G 6/00* (2006.01)

(52) U.S. Cl. .................. 60/641.11; 60/641.15

(58) Field of Classification Search .......... 60/641.8, 60/641.11, 641.15
See application file for complete search history.

(56) References Cited

U.S. PATENT DOCUMENTS

| 3,800,761 | A | | 4/1974 | Sata |
|---|---|---|---|---|
| 3,982,878 | A | | 9/1976 | Yamane et al. |
| 4,099,381 | A | * | 7/1978 | Rappoport ............. 60/641.1 |
| 4,674,463 | A | | 6/1987 | Duckwork et al. |
| 4,727,930 | A | * | 3/1988 | Bruckner et al. ........ 165/111 |
| 4,841,731 | A | * | 6/1989 | Tindell .................. 60/641.8 |
| 5,016,599 | A | | 5/1991 | Jubb |
| 5,228,529 | A | * | 7/1993 | Rosner ................... 180/65.3 |
| 5,958,761 | A | | 9/1999 | Yogev et al. |
| 6,477,841 | B1 | | 11/2002 | Yantovsky |
| 6,610,193 | B2 | * | 8/2003 | Schmitman ............. 205/628 |

FOREIGN PATENT DOCUMENTS

| DE | 3710611 A1 | 10/1988 |
|---|---|---|
| EP | 0 640 794 A2 | 3/1995 |

* cited by examiner

*Primary Examiner*—Hoang Nguyen
(74) *Attorney, Agent, or Firm*—Miles & Stockbridge PC; Mark A. Catan

(57) ABSTRACT

A generating facility is provided for generating electricity from both solar and non-solar energy sources. The solar generating portion of the facility includes capability to directly generate electricity from solar insolation, or to store the solar energy in a tangible medium, including stored heat, or solar generating fuel. The generating facility is configured to generate electricity simultaneously from both solar and non-solar sources, as well a solely from immediate solar insolation and from solar energy stored in a tangible medium. Additionally, the solar generating capacity may be segregated; such that separate spectra of solar insolation are used to capture heat for steam turbine based electrical generation, capture light energy for photovoltaic based electrical generation, and to grow biomass to generate a solar fuel.

30 Claims, 8 Drawing Sheets

HYBRID GENERATION WITH ALTERNATIVE FUEL SOURCES

This application is a continuation-in-part of U.S. application Ser. No. 10/760,915 filed Jan. 20, 2004 now U.S. Pat. No. 7,191,736 which claims benefit of U.S. Provisional Application Ser. No. 60/441,088 filed Jan. 21, 2003. This application also claims benefit of U.S. Provisional Application Ser. No. 60/575,301 filed May 28, 2004; U.S. Provisional Application Ser. No. 60/575,300 filed May 28, 2004; U.S. Provisional Application Ser. No. 60/575,759 filed May 28, 2004; U.S. Provisional Application Ser. No. 60/575,225 filed May 28, 2004; U.S. Provisional Application Ser. No. 60/575,641 filed May 28, 2004; U.S. Provisional Application Ser. No. 60/584,653 filed Jul. 1, 2004; and U.S. Provisional Application Ser. No. 60/611,825 filed Sep. 21, 2004.

BACKGROUND OF THE INVENTION

1. Field of the Invention

The present invention relates to the field of electrical power generation, more particularly to the field of hybrid electrical power generation wherein at least a portion of the power generated is derived from sources other than fossil fuels.

2. Background of the Art

Generation of electricity for purposes of transmitting the electricity over the power grid has traditionally been performed by the burning of fossil fuels for heat energy, transferring that heat energy to water to boil the water into superheated steam, and then expanding the superheated steam through a steam turbine and extracting useful energy from the steam through a generator coupled to the steam turbine. Fossil fuels such as coal, oil, natural gas, lignite and the like have been combusted to provide heat to heat the water into steam. Alternatively, nuclear or solar based heat has been used to heat water for steam based electricity generation. An additional fossil fuel based generation scheme includes the combusting of natural gas in a gas turbine engine, which is coupled to an electrical generator, to create electricity.

It is also known in the art to combine heat or energy sources, such as solar, with non-solar generation sources, such as fossil fuel based sources to generate electricity. Such combined source generation facilities are commonly referred to as hybrid generation facilities.

The worldwide majority of commercial level electric power produced from Solar and provided to the electric grid from a centralized plant is provided by the SEGS (Solar Electric Generating Systems) plants built by LUZ International between 1985 and 1991. The SEGS power stations, which are located in Daggett, Boron and Hinkley, Calif., are all hybrid Solar-Thermal plants. Each of these plants employ a common solar energy collection strategy, which is based upon collecting the solar radiation through parabolic mirrors, creating a "Line" of intensely focused and collected sunlight, which is directed along and into a pipe which is transparent to at least some of the wavelengths of the focused and collected sunlight. This light energy is absorbed or collected in a heat transfer fluid (HTF) which is flowed through the pipe, the fluid being heated to a temperature on the order of 400° C. at the pipe exit. This heat transfer fluid is then pumped into a water vaporizer (Heat Exchanger), where the heat in the HTF is exchanged into the water, i.e., the water comes in cold and leaves hot and the HTF comes in hot and leaves cooler. This results in boiling of the water and the generation of steam, which is then directed through piping to a steam turbine-generator set, the generator of which is coupled to a transformer to supply its power to the local commercial electric grid.

To enable the SEGS plants to be reliable power generating facilities, i.e., a generating facility which can produce electricity at its rated capacity in the presence of full sunlight, during periods of fluctuating solar insolation, and when no sunlight is present, SEGS plants are permitted, by government regulation (which allows the electricity generated to still be considered "solar" for regulatory purposes), operate from heat provided from sunlight and alternatively from heat provided from fossil fuel so long as two additional criteria are met:

The SEGS plant must be able to produce its full rated capacity of electric power from solar radiation only, and if this condition is met, then The SEGS plant is allowed to produce (and sell as solar) electrical energy so long as no more than 25% of the thermal input energy producing the electrical output energy is provided from fossil fuels.

Additionally, under FERC, a SEGS plant is allowed to use only 25% of its total energy produced by burning Fossil Fuel (In most cases that fuel is Natural Gas), and FERC does not permit the usage of that gas to power a Gas Turbine as part of the Solar field power block Typically, to provide an electrical generating facility having both solar and fossil fuel energy sources which also meet the above standards, a gas-fired heater/boiler is placed between the solar field and the heat exchanger. By utilizing the heater/boiler, a steady and constant production of power can be guaranteed, especially during periods of "Peak" demand, despite fluctuations in solar radiation.

Such a Hybrid electrical generating facility is shown in FIG. 1, wherein the solar field 1 consists of a number of SCA's 1A (Solar Collector Assemblies). These SCA's are basically a light reflecting structure with high tensional stiffness, having capability to move and accurately track the sun's position throughout the day, which tracking is accomplished by a controller and drive system which are known in the art. The SCA's support an array of parabolically shaped mirrors, which as a group produce a "focal line," i.e., they together form a focused line of light at their focal point, which is intended to be positioned within the cylindrical boundary or envelope of a pipe in the SCA through which the heat transfer fluid is flowed. The pipe or Heat Collection Element (HCE) is placed collinear with, and in a position to surround, the focused line of sunlight, thus enabling the collecting of the solar insolation energy by heating the HTF passing through the pipe to about 400° C. as it exits the pipe. The Heat Transfer Fluid (HTF), which is typically a mineral or silicon based oil having a relatively high heat capacity and high boiling point, is pumped through the collection side of the system by the Pump 6, which first pumps the HTF from the collection pipe through a Buffer Tank 2, (where hot HTF may be temporarily stored to be used to supplement for minor fluctuations in solar insolation intensity). Exiting from Tank 2, the HTF enters into the Solar Superheater 14, (where the steam coming from the heat exchanger 3 on the water cycle side of the system is further heated to a higher temperature before entering to the second stage of the steam turbine). Exiting from the Solar Superheater 14, the HTF flows to the Heat Exchanger 3. In this heat exchanger the thermal energy carried by the HTF, is transferred to the water which turns the water into steam. The HTF exiting the Heat Exchanger passes through an Expansion Vessel 5, and thence is passed back to the Solar Field, thus creating a closed loop flow of the HTF fluid in the generation system.

The water passing through the Heat Exchanger 3, is converted into steam, which flows through the Solar Superheater 14, and then into the second stage of the Steam Turbine 7 where the steam is expanded and drives the steam turbine to drive the Generator 8 to output electric power which is fed to the Grid 9.

The (water saturated) steam being exhausted from the Steam Turbine 7 flows into the Recuperate (Steam Separator) 13, and then flows into the Water Cooled Condenser 12. In the Condenser the steam condenses back into water, which is pumped back through the Separator 13 to the non-operating Gas Heater 4. When solar insolation is at its peak, the condensed water passes through the Gas Heater 4, back to the Heat Exchanger 3. However, when solar insolation is not sufficient, and Natural Gas can be burned (according to the regulations of the Federal Energy Regulatory Commission, or FERC), the Gas Heater 4 is used to create superheated steam which is directed to the first stage of the steam turbine, and thus working in a closed loop through the Steam Turbine 7. In order to cool the steam in the Condenser 12, water is pumped by Pump 11 from the Condenser through a Cooling Tower 10 where it is cooled by ambient air.

The most valuable time for delivering power (In the present SEGS power plants, the buyer is Southern California Edison (SCE)), is during "On Peak" hours which are defined as weekdays except holidays from June 1st to September 30th, from Noon until 18:00. The number of "On Peak" hours varies from 504 to 516 hours annually.

A typical SEGS power plant delivers approximately 2,000 full capacity equivalent hours of electricity over a period of approximately 2,800 hours during the year. Approximately 1,500 of those full capacity equivalent hours come from solar insolation and approximately 500 full capacity equivalent hours comes from burning Natural Gas in the HTF heater, i.e., as the SEGS is capable of providing full rated capacity solely based on solar energy, it is allowed to generate, and sell as solar produced energy, up to 25% of its output from fossil fuel energy, in this case, natural gas.

The 1,500 solar sourced hours of electrical production are delivered based on the availability of incident light from the sun reaching the solar field. The 500 hours of natural gas produced electricity has typically been generated on a 1st priority basis to meet any additional heat requirements to augment the solar field in order to meet Contract On-Peak Capacity requirements, and on a 2nd priority basis the natural gas would be burned Mid-Peak in the summer hours which are the most valuable delivery non On-Peak hours. As a third priority, natural gas would be used to supply heat energy during Mid-Peak winter hours.

The current state of the art uses the solar field under typical On-Peak (peak utility company demand), Mid-Peak (mid peak utility company demand), and Off-Peak (minimum utility company demand) operations to run the entire power block, and therefore the solar field in sized so that from several hours before peak solar insolation to several hours after peak solar insolation the solar fields provide sufficient heat to power the entire power block.

SUMMARY OF THE INVENTION

The present invention provides methods and apparatus for the production of electricity, as well as electricity produced, using both solar and non-solar fuel sources. In one aspect, solar energy is used both to grow a secondary, solar, fuel, such as a biomass, including algae and derivatives thereof, and also to directly heat water for use in a traditional steam turbine cycle for the generation of electricity using a steam turbine-generator generator apparatus. The biomass and/or its derivatives may be used as fuel, which is a solar fuel captured in a tangible medium, to heat water in the boiler and thus provide solar based energy in addition to that simultaneously, or sequentially (previously or later) generated from sunlight. In a further aspect, oxygen and hydrogen may be produced, from either solar or non-solar energy, for use as fuel or an oxidizer in the generating facility, for storage for later use as fuel in the generating facility, or for sale. Where solar energy is used to create oxygen and hydrogen, such oxygen and hydrogen may be stored, and then used during non-solar insolation hours, to extend the range of the period during which solar based power is generated by the generating facility. This may occur during off peak hours, during storms where insufficient insolation is received at the facility, or during the night. This is provided, in one aspect, by driving a fuel cell in reverse to produce oxygen and hydrogen from water, and powering a gas turbine therewith. The gas turbine may also, if desired, be powered with fossil fuels, and may also, where desired, use an inert gas, such as argon, in place of air as the carrier gas.

In an additional aspect, the invention provides for the growing of a solar biomass fuel, such as algae, and if desired, the simultaneous use of solar energy to heat water for a steam turbine-generator. Additionally, sunlight for growing the solar fuel or biomass, as well as simultaneously generating electricity, may be further separated such that different spectra of sunlight may be appropriated for each use. In this aspect, sunlight is split, into different wavelength spectra, and directed, based upon the spectra, separately to a growing media for the growth of biomass, to a heat exchanger for the collection of light energy into a heat exchange fluid or directly into water for the purpose of making steam to drive a steam turbine generator, and/or to photovoltaic solar cells. In an additional aspect, the spectra of light directed to the biomass is selected to provide wavelengths which provide growth of the biomass, while excluding those that do not appreciable enhance biomass growth. Those wavelengths which are not directed to the biomass are thus used to heat the heat exchanging fluid or directly heat water, or to photovoltaic cells for direct electrical conversion.

The invention also readily enables retrofitting of solar fuel into existing combined solar-fossil fuel plants, thus increasing the rated power of the traditionally designed, built and operating SEGS plants whilst complying with FERC regulations. The solar energy generatable by the generating facility can be effectively increased, by virtue of the incorporation of the aforesaid aspects of the invention, by storing solar energy in a tangible form, including heated fluid or gas (such as the HTF), biomass or biomass derived fuels and solar generated fuel such as hydrogen, such that the peak solar power which can be generated by the facility is equal to the electricity generatable by the immediate incident sunlight or insolation, plus the energy generatable from the solar energy stored in the tangible medium, such as previously heated HTF, biomass or biomass derived fuels and hydrogen derived from solar energy. Thus, with minimal impact upon the physical size of a generating facility, it is possible to significantly increase the allowable energy permitted to be generated thereby, because "solar" fuel and solar insolation are simultaneously being used to generate electricity.

In yet an additional aspect, the hybrid generating facility may be constructed and operated in a zero emission mode, wherein a biomass fuel or other fuel is combined with argon or another inert gas, and combusted in a closed cycle, such that the exhaust thereof is scrubbed of emission products, as well as the inert gas and other byproducts of combustion are recovered, and reused, in the growing of the biomass or in the combusting of the biomass to generate electricity in a system such as a gas turbine-generator set. Additionally, the generating facility operator is able, in this mode, to accept greenhouse gases such as carbon dioxide from third parties, and use such carbon dioxide as a source of nutrients for the biomass.

DESCRIPTION OF THE EMBODIMENTS

Figure 1:
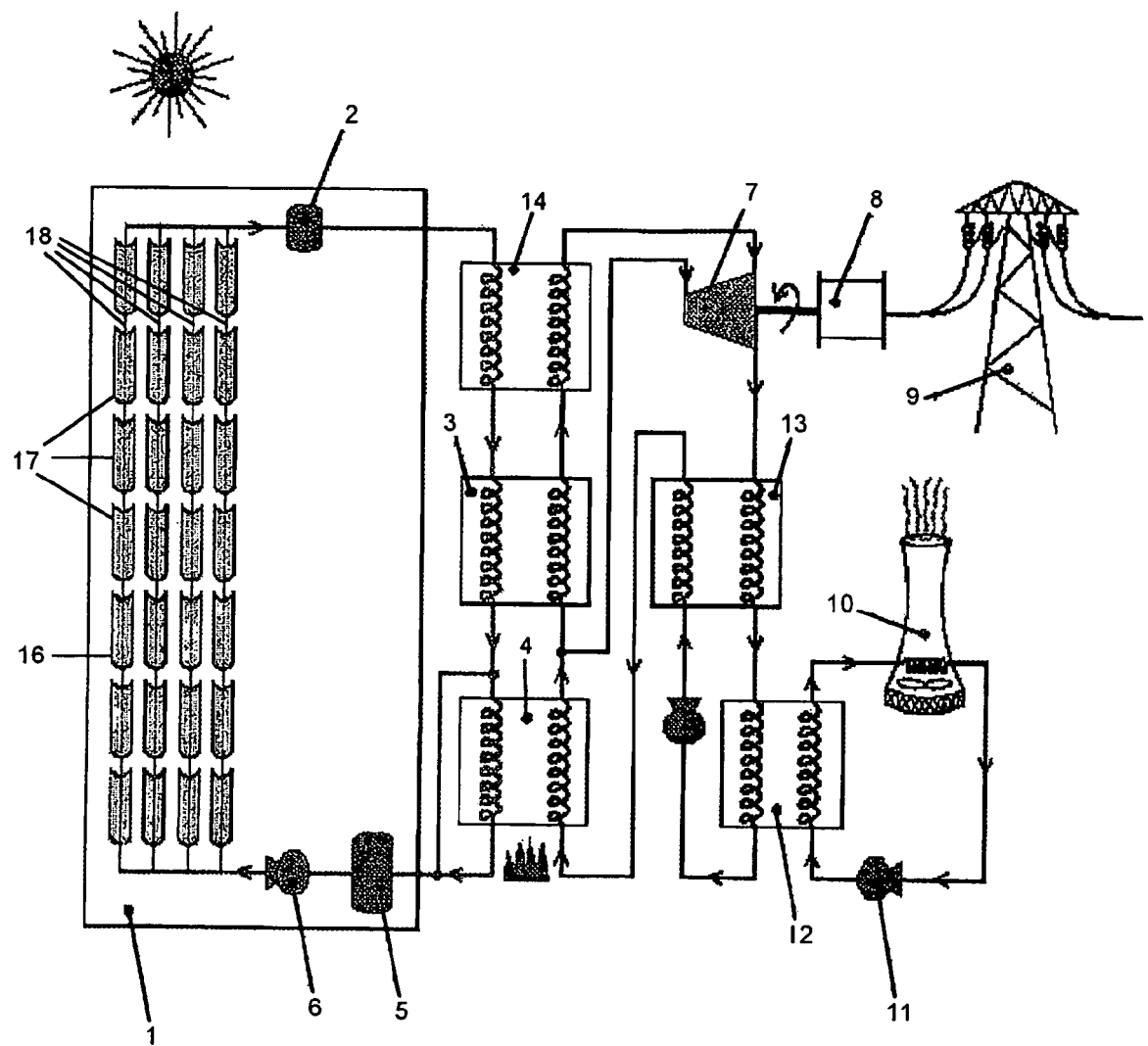
FIG. 1 is a schematic of a prior art solar generation facility.

The invention provides a plurality of methodologies and apparatus for enabling the increase in solar output from a solar generating facility, including Hybrid generating facilities. In one aspect, the invention provides for the use of solar energy to produce economical high calorific fuel, hereinafter called Solar Fuel, which is suitable for the purpose of providing a fuel for powering a standard Gas Turbine coupled to an electrical generator. Additionally, the waste heat from the Gas Turbine may be used to power a Steam Turbine, thus boosting the efficiency of a solar generating facility to a higher level—This combination of gas and steam turbines is called a Combined Cycle (CC) system (See FIG. 2), and is presently commercially available and known to one skilled in the art.

In additional aspects, a method is provided for operating a combined or Hybrid solar-fossil fuel generating facility, in which solar energy is captured in a tangible form, such as a fuel, for further use in the generating facility, and such fuel is used to generate electricity in the facility. In one aspect, the solar based fuel and the total quantity of natural gas permitted to be burned, will be burned primarily "On-Peak" and will be used as fuel for the Gas Turbine, where there will be a substantial gain in power and energy produced due to the higher efficiency of the Combined Cycle.

Referring again to FIG. 1, a prior art generating facility is shown schematically, and includes the solar field 1 consisting of a number of SCA's (Solar Collector Assemblies). These SCA's are basically a light reflecting structure with high tensional stiffness, having capability to move and accurately track the sun's position throughout the day, which is accomplished by a controller and drive system which are known in the art. The SCA's support an array of parabolically shaped mirrors, which as a group produce a "focal line", i.e., they together form a focused line of light at their focal point, which is intended to be positioned within the cylindrical boundary or envelope of a pipe through which the heat transfer fluid is flowed. The pipe or Heat Collection Element (HCE) is placed collinear with, and in a position to surround, the focused line of sunlight, thus enabling the collecting of the solar insolation energy by heating the HTF passing through the pipe to about 400° C. as it exits the pipe. The Heat Transfer Fluid (HTF), which is typically a mineral or silicon based oil having a relatively high heat capacity and high boiling point, is pumped through the collection side of the system by the Pump 6, which first pumps the HTF from the collection pipe through a Buffer Tank 2, (where hot HTF may be temporarily stored to be used to supplement for minor fluctuations in solar insolation intensity). Exiting from Tank 2, the HTF enters into the Solar Superheater 14, (where the steam coming from the heat exchanger 3 on the water cycle side of the system is further heated to a higher temperature before entering to the second stage of the steam turbine). Exiting from the Solar Superheater 14, the HTF flows to the Heat Exchanger 3. In this heat exchanger the thermal energy carried by the HTF, is transferred to water which turns into steam. The HTF exiting the Heat Exchanger passes through an Expansion Vessel 5, and thence is passed back to the Solar Field, thus creating a closed loop flow of the HTF fluid in the generation system. The water passing through the Heat Exchanger 3, is converted into steam, which flows through the Solar Superheater 14, and then into the second stage of the Steam Turbine 7 where the steam is expanded and drives the steam turbine to drive the Generator 8 to output electric power which is fed to the Grid 9.

The (water saturated) steam being exhausted from the Steam Turbine 7 flows into the Recuperate (Steam Separator) 13, and then flows into the Water Cooled Condenser 12. In the Condenser the steam condenses back into water, which is pumped back through the Separator 13 to the non-operating Gas Heater 4. When solar insolation is at its peak, the condensed water passes through the Gas Heater 4, back to the Heat Exchanger 3. However, when solar insolation is not sufficient, and Natural Gas can be burned (according to FERC), the Gas Heater 4 is used to create superheated steam which is directed to the first stage of the steam turbine, and thus working in a closed loop through the Steam Turbine. In order to cool the steam in the Condenser 12, water is pumped by Pump 11 from the Condenser through a Cooling Tower 10 where it is cooled by ambient air.

Figure 2:
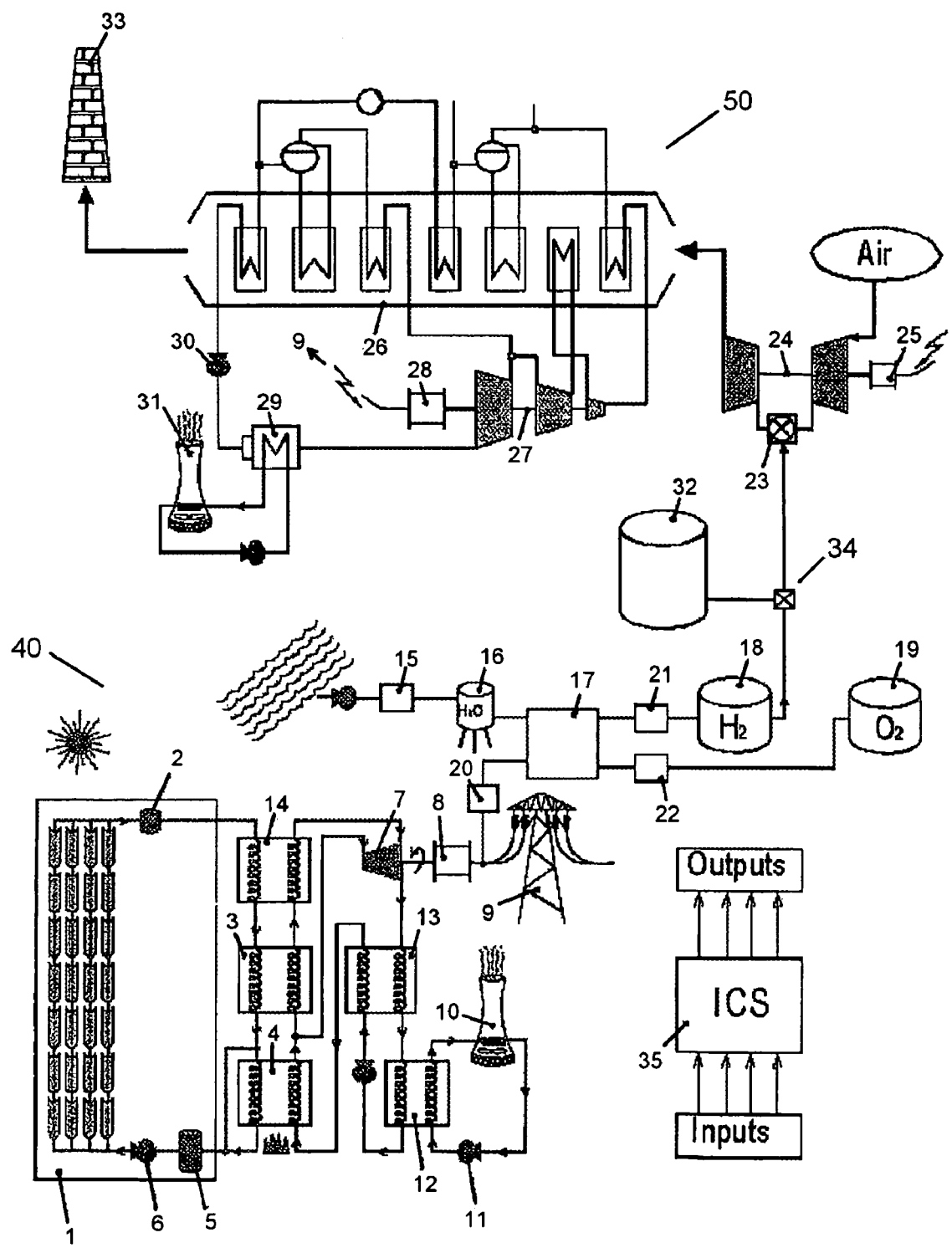
FIG. 2 is a schematic of a combined solar facility of the present invention.

Referring now to FIG. 2, modifications and additions to the prior art SEGS system of FIG. 1 are shown. Initially, water is brought from a water source, and pumped by a pump through a filter 15 and delivered to a tank 16, from which it will be pumped to a reactor/separator 17 such as a modified Fuel-Cell. The reactor/separator 17 is electrically powered by the generator 8, via a power conditioning unit 20. Generator 8 is driven by the steam turbine 7. The separator 17 is breaking, and/or separating water into its two main components of Hydrogen and Oxygen. In one aspect, this is provided by powering a fuel cell, such that water therein is broken down into hydrogen and oxygen. Each of the hydrogen and oxygen so generated are then separately recovered and compressed by units 21 and 22 and stored in separate tanks 18 and 19. The hydrogen can thus provide a solar fuel, which is clean burning, and the Oxygen can be sold, released to the atmosphere or also combusted for power generation.

Referring still to FIG. 2, the compressed hydrogen in tank 18 is selectively flowed into power generating system 50, for use as a "solar" fuel for the production of electricity. It should be appreciated that the hydrogen is recovered in this embodiment from the solar electrical generating portion 40 of the generating facility, and it is specifically contemplated that the energy needed to generate the hydrogen will be no more than, and preferably less than, that provided by the solar generating facility 40. The hydrogen is selectively flowed through a combustion control system 23, which controls the gas flow and the gas turbine 24, which in turn drives an electricity generator 25 supplying the power to the grid 9 (FIG. 1). Hydrogen from tank 18, or natural gas from tank 32 or other soured such as a pipeline, may be alternatively or simultaneously flowed to the gas turbine, the selection of which is controlled by valve 34. The waste heat from the gas turbine flows into the Heat Recovery Steam Generator 26. Within the Heat Recovery Steam Generator 26, there is an array of multiple water vaporizers (usually 3 stages). These water vaporizers generate steam in a variety of temperatures, from high temp, super-heated to relatively low temp saturated steam. This steam is flowing to the various inputs of the Steam Turbine 27 (also usually 3 inputs.). The steam turbine 27 drives a generator 28, supplying the power to the grid 9. A water cooled condenser 29, is condensing the exhausted steam, turning it into water which is then re-circulated to the Heat Recovery Steam Generator 26, by water pump 30. The water used for cooling the condenser is being cooled by a cooling tower 31. The waste gas from the Gas Turbine 24, after passing through all the vaporizers within the "Heat recovery steam generator" is being exhausted to the atmosphere through stack 33.

The generation of the hydrogen from solar sources, and the use of the hydrogen to generate power in a gas turbine, substantially increases the usefulness and interchangeability of solar generating facilities. Unlike prior art systems, where the solar energy was used to heat water for purposes of driving a steam generator, clean burning hydrogen is now generatable from solar sources and useable in a gas turbine to directly generate solar based energy therein. Additionally, the hydrogen may be used in other generator systems, including internal combustion engines coupled to a generator, or may simply be burned to generate heat to boil water for a steam turbine generating facility. Further, the generating facility may alternatively create hydrogen and directly generate electricity through the standard SEGS unit, or, the insolation occurring in a period of time may be supplemented with previously created and stored hydrogen such as by burning the hydrogen in the gas turbine which simultaneously operating a steam turbine with solar insolation generated heat energy from the solar field 1. Thus, an increase in the overall maximum solar output of the system is possible, without the need for additional solar field.

Figure 3:
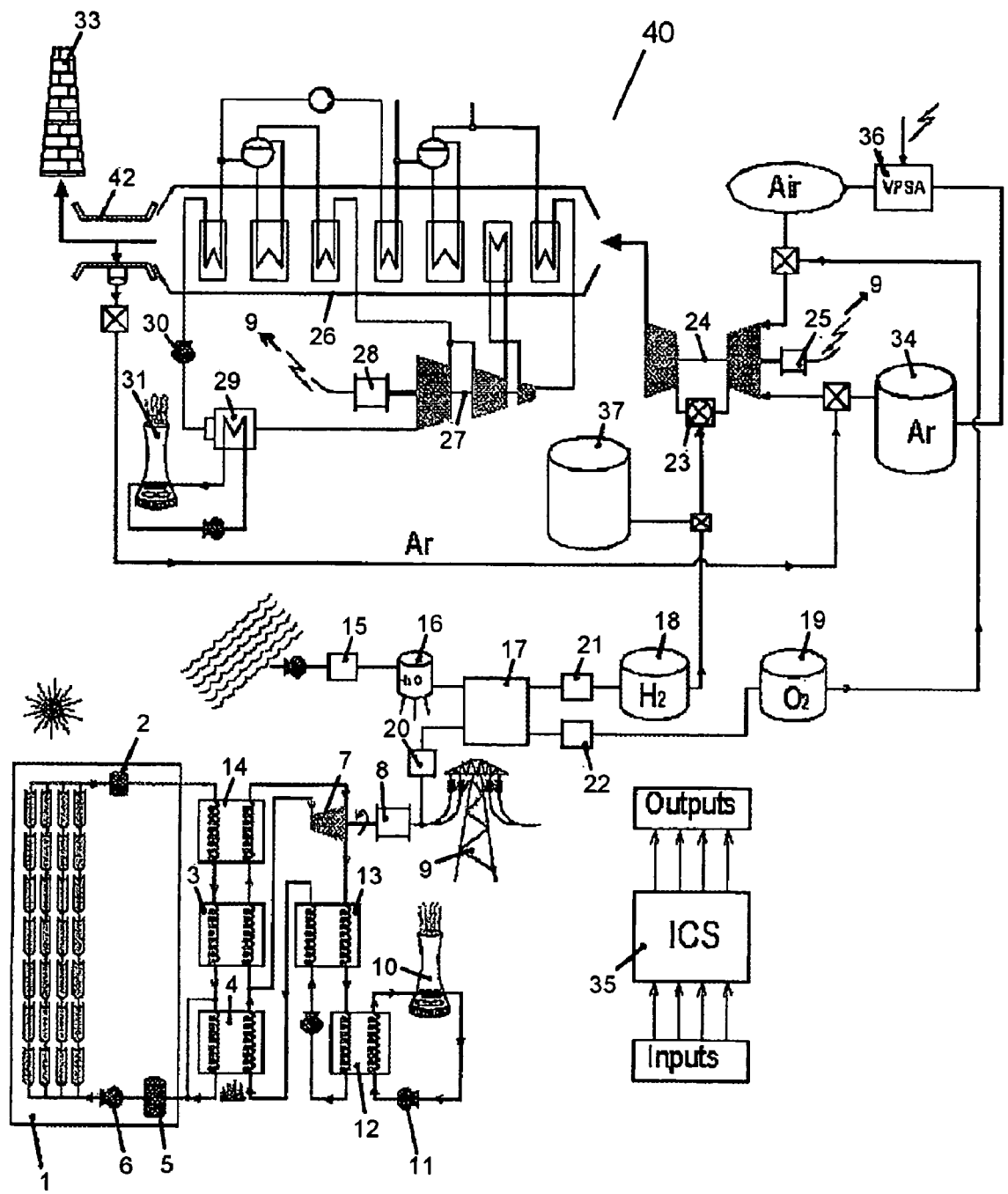
FIG. 3 is a schematic view of an alternative embodiment of the combined solar facility of FIG. 2.

Referring now to FIG. 3, a further embodiment of the invention is shown, wherein the generating facility is further modified from the prior art facility of FIG. 1 to be operated in a "Zero Emissions" mode to reduce or eliminate the exhaust of Nitrogen Oxides (NOx) from the facility. In this embodiment, Argon gas is produced from atmospheric air by a VPSA unit 36 (vacuum pressure swing absorption) and stored in tank 34. The energy to operate the VPSA may be provided directly from generating facility 50. The Argon gas so generated is supplied, in the place of atmospheric air, to the gas turbine. Since Argon is a noble gas, it does not react with any of the combustion components being combusted in the gas turbine, and it therefore may be separated ("cleaned") from the gas turbine exhaust stream by a gas separator 42, and fed back to the tank 34 and thus flowed again through the gas turbine 24. All the other components besides Argon are exhausted to the atmosphere through Stack 33. Due to normal leakage of Argon gas in the system, new gas is constantly supplemented from tank 34.

Since Air is not used for combustion in this embodiment the Oxygen needed for combustion is taken from storage tank 19. The control of the entire power plant (Solar part and the CC part, or either option) is managed by a Control System 35 which includes a computer, monitoring and feedback devices and controllers, and is known to those skilled in the art.

As described in the Background of the Invention, it is not economical to normally operate the SEGS plants during "Off-Off Peak" and "Off-Peak" Times Of Delivery (TOD). However, a SEGS facility as described and operated in accord with FIGS. 2 and 3 can be fully operational whenever sufficient solar insolation is available. The electricity produced by the steam turbine (only) and powered by the thermal energy from the solar collectors will be used to power the Water Reactor Separator and the storage systems for Oxygen and Hydrogen. The Hydrogen Gas is a high calorific fuel and since it was produced by natural solar insulation, it will be classified as "Solar Fuel", thus enabling the operation of a combined cycle whilst meeting FERC regulations and, as mentioned above, an additional amount of 25% of the energy produced by the "Solar Fuel" will be allowed to be produced by burning additional Natural Gas. Thus, a significant increase in the available energy output of the system is possible without the need to increase the size of the solar field, although one may wish to increase the size of the solar field to take further advantage of the increase in power output enabled by the invention.

In one aspect, during "Off-Off-Peak" and "Off-Peak" and occasionally also during "Mid-Peak", and if during these TODs the solar insolation is high, the generating facility will fully operate its Solar Field and produce electric power which will be solely used to power the water separation and storage systems. During "On Peak" and where practicable "Mid Peak" TOD, the Solar Fuel and the total amount of Natural Gas that can be burned will be used in the following modes of operation;

1. The Gas Turbine of the Combined Cycle system is powered by the compressed Hydrogen released from tank 18; ambient air is used for mass flow of the hydrogen into and through the turbine, where the Oxygen in the Air is used as the Oxidizer for combusting the Hydrogen. Using Hydrogen as the fuel for the Gas Turbine (instead of Natural Gas) will also elevate the combustion temperature, thus increasing the overall thermodynamic efficiency of the CC. This type of high temperature combustion with normal air atmosphere will increase the level of Nitrogen Oxides (NOx) in the exhaust gas and will also emit Carbon Dioxide (CO2).

2. In a second mode of operation, Argon gas as the mass flow medium and both the Hydrogen and the Oxygen previously generated from solar energy are released from tanks 18, 19 and directed to the gas turbine 24 for combustion therein. This mode has the following additional advantages;
   1. Reduction or elimination of NOx emissions;
   2. A higher capacity rating from the Gas turbine, on the order of 17%, because to the higher level of the specific heat of Argon (vs. Air); and
   3. Recycling of a portion of the argon by a separator 42.

In both cases as described above, the steam turbine powered solely by the solar field runs in parallel to the Combined Cycle. This combination of a CC powered by "Solar Fuel" together with the steam turbine powered by the "standard" solar field enables an increase in electricity produced. Moreover this extra power is sold to the utilities at "On Peak" TOD for a premium price, thus substantially improving the economics of the future SEGS.

Figure 4:
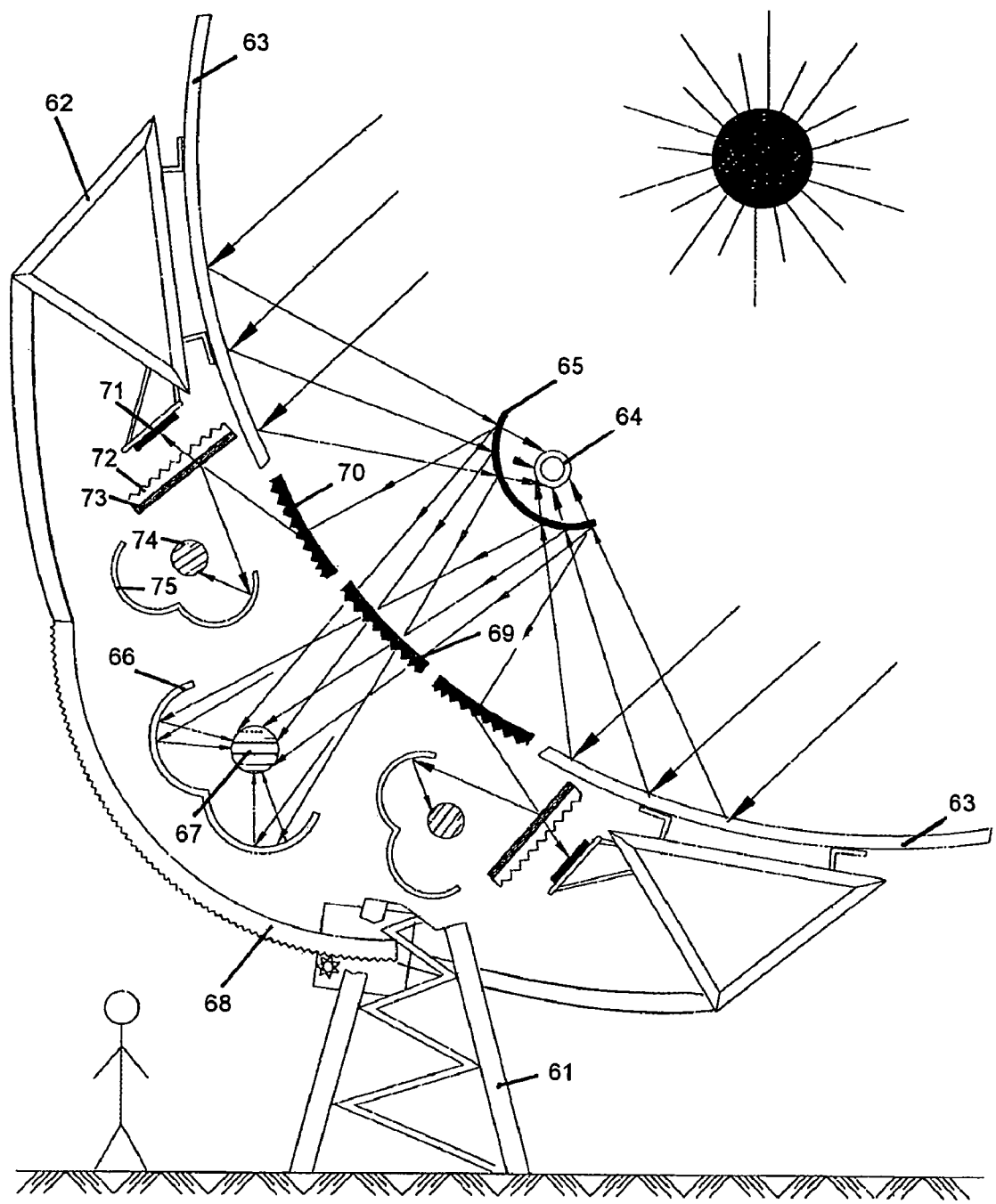
FIG. 4 is a schematic view of an apparatus for separating the solar radiation spectrum into discrete sub-spectra.

Referring now to FIG. 4, there is shown an additional embodiment of the invention, wherein the sunlight used for solar generation is spectrally separated, such that individual spectra or groups of spectra are selectively used to grow a biomass for solar fuel generation, photovoltaic electrical generation, and steam turbine based electrical generation. In this embodiment, which may be used in conjunction with the solar field 1 of the embodiments hereof shown and described with respect to FIGS. 2 and 3, or simply as an improvement in the prior art SEGS facility of FIG. 1, there is schematically shown a pylon structure comprised of pylon(s) 1 (only one shown), and a high torsional stiffness frame 62 coupled thereto (the coupling not shown) which supports a plurality of parabolically shaped mirrors 63. The entire structure is configured to track the sun's movement by a tracking system 68 comprised of an arcuate rack coupled to a pinion (not shown). By turning the pinion, the rack moves the entire structure through an arc which keeps the mirrors aimed at the sun. It is specifically contemplated that multiple such pylons may be linearly arranged to provide multiple focused portions of the solar spectrum to a heat collection element 64.

Solar radiation at its entire spectrum is received at the mirrors 63, and reflected thereby and focused by virtue of the curvature of the mirrors 63 towards the Heat Collection Element (HCE) 64, while passing through a Filter/Reflector device 65. The Filter/Reflector device 65 separates and reflects back the light spectrum which is optimized for Bio Mass and Photovoltaic applications; the remainder and major portion of the spectrum passes through filter/reflector device 5 and delivers its energy to the HCE in order to heat a heat transfer fluid that is used to heat water to steam for use to generate steam for driving a steam turbine-generator combination. Although the use of specific reflectors and spectra separators are disclosed, other arrangements for splitting the spectrum of insolation, and for concentrating the insolation into a fluid heat exchange medium are specifically contemplated herein. Additionally, it will be appreciated that certain support elements to interconnect mirrors 63, lenses, reflectors and heat collection elements to the tracking system 68 are omitted for clarity in the drawing, and the construction of such elements is within the scope of one skilled in the art.

That portion of the light spectrum which is reflected back by the Filter/Reflector device 65 is passed through filter 69 and is collected by a CPC collector, focusing the said spectrum onto the Bio-Reactor 67, in which a specific type of algae is being grown. Specifically, filter/reflector 65 is selected so that the range of wavelengths of the light received by the Bio-reactor 67 is specifically beneficial for growing the algae or other biomass therein.

The other range of wavelengths of the reflected spectrum from the Filter/Reflector device 65 is diverted towards the prism 70, where the light passing through falls onto the Filter/Reflector device 73. The Filter/Reflector device 73 allows therethrough that portion of the spectrum which is optimal for photovoltaic applications, whilst reflecting back some other specific light spectrum that might be optimal for growing another type of algae different from the one growing in Bio-Reactor 67. The light spectrum passing thru filter/reflector 73 is being focused by a "Fresnel" type of lens 72 to create a high concentration ratio of that specific solar radiation spectrum and to activate the photovoltaic cells 71.

In an additional aspect, the biomass growing in the bioreactor 67 will be supplied with carbon dioxide and nutrients, it being specifically contemplated that the $CO_2$ may be collected from utilities which will pay the solar generating facility to dispose of the carbon dioxide. The bioreactor will enable the growth of certain types of algae, whereby during the biological process of the growth, $CO_2$ is needed as a nutrient and therefore consumed in large quantities. This $CO_2$ may be collected from utilities to enable them to lower their carbon dioxide emissions.

Figure 5:
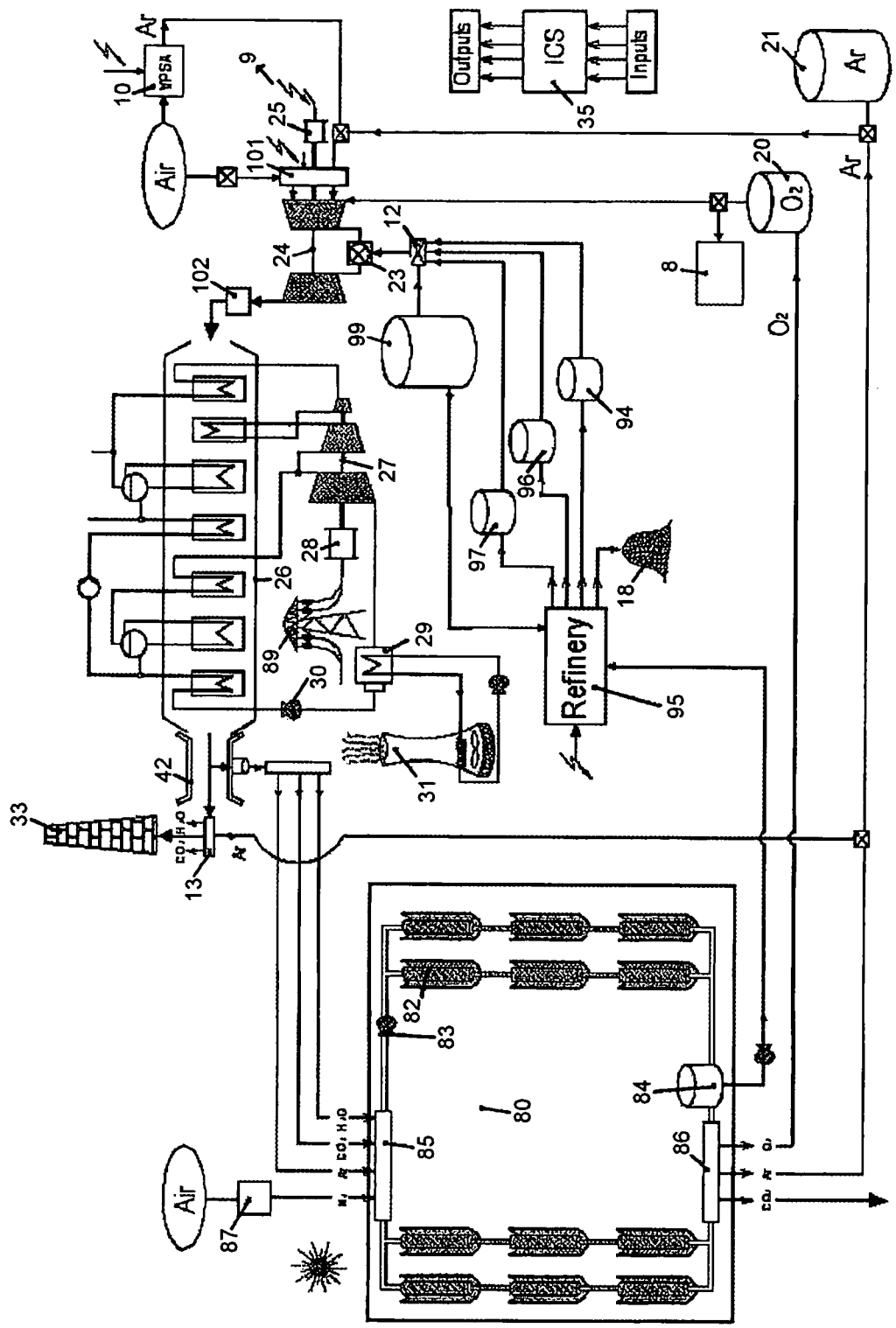
FIG. 5 is a schematic view of a hybrid generating facility including the capability to engage in "zero"-emissions hybrid electricity generation.

Referring now to FIG. 5, there is shown an additional embodiment of the present invention wherein a solar fuel such as algae is grown and harvested as a "solar" fuel. In this embodiment, the generating facility may be operated in a low emissions or zero emissions mode, wherein the oxygen produced during photosynthesis of the algae may be used, in combination with argon as the carrier gas, to combust the solar fuel. The solar fuel may be burned directly, or may be further processes such that derivatives thereof provide the solar fuel. This aspect contemplates Large scale Algae production in "Solar Bio-Reactor Units," (such as, but not limited to the Bio-Reactor described in U.S. Pat. No. 5,958, 761). When further processed in a Refinery as is known in the art, the Algae may be converted into a variety of high calorific fuels, suitable for use in a Combined Cycle Gas Turbine, thus enabling the production of electric power much more efficiently than by a Steam Turbine as at the presently operating SEGS facilities. The fuel(s) produced in the "Solar Bio-Reactor Units" and the associated Refinery, is Solar Fuel, meaning that under FERC, the energy produced from burning the Solar Fuel will enable the power plant operator/owner to produce an additional 25% of the said amount of energy by burning fossil fuels such as Natural Gas.

In an additional aspect of this embodiment, the by-products of combustion are recovered and reused, including carbon dioxide reused as a feedstock for the biomass, which would otherwise be wasted and in some cases (such as carbon dioxide) become an emission issue. Alternatively, the byproducts may be recovered and sold.

Usually, Bio-Mass in such a Bio-Reactor is produced when a specific type of a Algae is fed with nutrients such as Nitrogen, Carbon Dioxide, and Water, and is exposed to a concentrated (4 to 7 'Suns'), and uniquely filtered solar spectrum. The current design calls for an array of glass tubing, where the liquid (mostly water) containing the Algae and the necessary nutrients. The glass tubes are usually placed at the focal point of a CPC (Compound Parabolic solar Concentrator) type of a reflector, generically similar to the mirrors 63 or reflector 65 of FIG. 4 (but lacking the spectra splitting capability of the FIG. 4 configuration) capable of providing solar insolation almost homogeneously around the circumference of the glass tubing. The water solution inside the glass tubes is pumped by a special pump such as a food handling pump which does not damage the Algae while conveying it throughout the piping system. While flowing in the glass tubes, the Algae are also stirred; this is essential in order to maintain a high statistical probability that each cell of the Algae will have maximum exposure to the filtered spectrum of solar radiation. Once the algae is has reproduced and or grown to a desired state, it is released from the Bio-Reactor and pumped into an Refinery wherein the Algae are processed to a variety of high calorific fuels, which are suitable for optimal combustion in an engine such as in a Gas Turbine. Since the Bio-Fuel is produced by natural solar insulation, it will be classified as "Solar Fuel" thus enabling to run a Combined Cycle (CC) turbo generator, while meeting FERC regulations.

Figure 8:
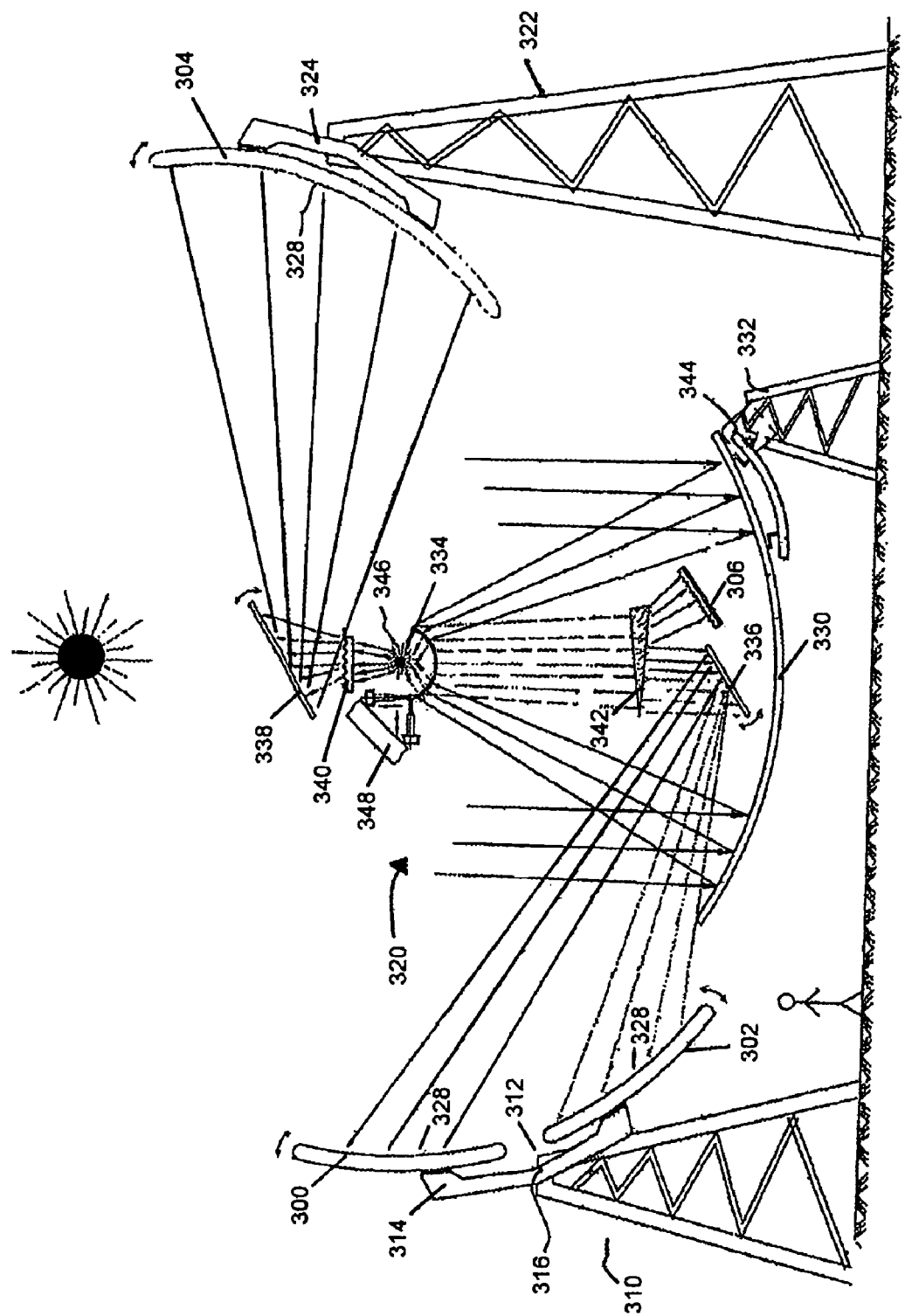

Referring now to FIG. 8, an additional aspect or construct of solar spectrum splitting for the production of solar fuel and the production of electricity is shown. In this aspect, multiple biomass reactors, 300, 302 and 304 are supplied with discrete spectra of incoming sunlight, and a photovoltaic electricity production unit, such as a solar cell 306 likewise receives a portion of the spectra.

In the specific embodiment shown in the Figure, a first tower 310 has, adjacent to the upper end 312 thereof, a tracking support 314 on which biomass reactors 300 and 302 are supported. As is appreciated by one skilled in the art, Support 314 is mounted such that it may be rotated about its approximate center 316, in a controlled fashion such as through a servo motor or stepper motor ultimately controlled by a system controller, to adjust the relative aspect of the support 314 with respect to a grouping of mirrors and lenses 320. An additional second tower 322, having a substantially similar construction to that of tower 310, supports biomass reactor 304 on a support 322 likewise rotatable in a controlled fashion about its center 324. Each of the biomass reactors 300, 302 and 304 are generally hollow, arcuate segments (and can be a parabolic segment) of a light transparent or at least transparent or substantially transparent in the biomass growing light frequencies, material, having a mechanism for flowing water and nutrients therethrough, and to flow the grown biomass and any exhaust or biomass "waste" gasses therefrom for collection. The arc of the biomass 300, 302 and 304 reactors is configured such that equal, or nearly equal, quantity of light reaches all regions of the front faces 328 thereof. The reactors 300, 302 and 304 may be tubular with a round, rectangular, ovoid or other cross section.

The grouping of mirrors and lenses 320 is, in this embodiment, located between the two towers 310, 322, and include generally a main mirror 330 of a generally arcuate segment construction, i.e., parabolic, which is supported by mirror positioning tower 332, a generally parabolic partially transparent mirror 334, a first biomass directing reflector 336 and a second biomass directing reflector 338. Additionally, a beam spreader 340 is disposed between partially transparent mirror 334 and second biomass reflector 338, and a beam splitter 342 is disposed between partially reflective mirror 334 and first biomass reflector 336. To move main mirror 330 to track the sun, tower 332 includes a rack and pinion 344 type of motion device, such that the main mirror 330 is supported on the rack portion, and rotation of the pinion changes the aspect of the main mirror 330 vis a vis the sun to focus the light reflected from the upper surface of the mirror to the theoretical center or focal point 346 of light passing through of the partially reflective mirror 334. Likewise partially transparent mirror 334 is moveable by a two axis actuator 348.

In operation, sunlight reaching the upper surface of main mirror 330 is reflected and focused toward partially transparent mirror 334, and a portion thereof is reflected back toward the beam splitter 342 and a second portion passes therethrough and is focused at focal point 346. The portion reflected is split at beam splitter 342 such that the wavelengths useful for photovoltaic electricity production are directed to a solar cell 306, and the wavelength portion useful for biomass production is directed by first biomass reflector 336 at first and second biomass reactors 300, 302. Additionally, that portion of the light passing through partially transparent mirror 334 is directed through focal point to beam spreader 340 which functions as a diffuser to spread the light angularly. This light then is reflected by second biomass reflector 338 to the biomass reactor 304. The partially reflective mirror 334 may also include wavelength discrimination, such that the light passing therethrough is of a different spectrum, or at least includes different spectra, than that reflected. Thus, a biomass may be grown in the reactor 304 which is different than that grown in reactors 300, 302 and each biomass is selected to be growable with specific spectra of wavelengths of light.

Thus, both biomass of different kinds may be grown for solar fuel, and electricity directly generated, by the solar system.

To support the grouping of mirrors and lenses other than main mirror 330, a superstructure is provided, to which the reflector 338, beam spreader 340 mirror 334, reflector 336, actuator 348, beam splitter 342 and solar cell 306 are supported on a superstructure, (not shown for clarity of the optical elements) which is configured and arranged to support these elements above and in a known physical relationship (i.e., such that main mirror 306 focuses to focal point 146) above main mirror 306, such as by extending these elements horizontally cantilevered from a fixed pylon, providing a pair of towers which are located to either side of the main mirror 306 across which are suspended these elements, or other arrangements which are well within the scope of one skilled in the art. It should be appreciated that in the aspect of FIG. 8, as well as that of FIG. 4, the elements such as the mirrors, lenses collectors and solar cells are being viewed in the figures as on edge, and that in use, they will extend several meters to substantially greater lengths, (into or out of the paper of the Figure) and that multiple such arrangements of mirrors, lenses, collectors and solar cells may be joined together to provide solar fuel and electrical generation, and the solar fuel produced my be used in a combustion based electrical generation facility located in the vicinity of the apparatus, or remote therefrom, and the apparatus may use waste products of the combustion based generation, in particular, carbon dioxide, as a feedstock for biomass growth, and may also generate materials such as oxygen as a byproduct of biomass growth. Likewise, the apparatus may be used in conjunction with a feedstock of carbon dioxide from third party sources, such as a remote combustion based generation facility which recovers its carbon dioxide and supplies it to a generating facility using the apparatus of FIG. 4 or 8 in the growth of biomass, for which the receiving entity may charge for disposal of the carbon dioxide. Unlike the presently operating SEGS plants built by LUZ International in California, USA, where the SCAs were designed to produce only thermal energy, these SCA's combine biomass applications where sunlight is used for agricultural purposes and the residual agricultural waste is used as a source of useful energy, photovoltaic applications and also the traditional "Solar Thermal."

The technological basis that enables such a combination of solar applications is the ability to optimize the utilization of the solar radiation spectrum. The whole solar spectrum is divided in such a way that each application will receive its optimal range of the spectrum, thus enabling maximum efficiency or yield for that specific application. For example, for biomass applications such as growing the "Dunaliella" type Algae, the optimized range of the spectrum will be the "Red" portion. For photovoltaic, as well as solar thermal applications different ranges of the spectrum are be used.

Referring now to FIG. 5, the improvement or modifications to the standard prior art SEGS generating facility of FIG. 1 are schematically shown. The solar generating facility of this embodiment includes a solar field" 80, which is comprised of "Solar Bio-Reactor Units" 82, (such as, but not limited to the Bio-Reactor described in U.S. Pat. No. 5,958, 761 and incorporated herein by reference). The Bio-Reactor 2 is designed to rapidly and efficiently grow a variety of types of Algae. The solution containing the Algae is circulated throughout the "Solar Bio-Reactor Units" 82 by a pump 83, such as a food handling pump. Nutrients necessary for the optimal growth of the algae are supplied to the solution by means of intake manifold 85 and by-products of the algal growth process, such as (excess) $CO_2$ and $O_2$ are released by means of manifold 86. Tank 84 is used to store "Harvest quality" algae, and at the same time also serves as a buffer tank to ensure the optimal hydraulic conditions of the flow. The harvested algae or the "Solar Fuel" is then pumped to a refinery station 95. The output of the Refinery can be (but not limited to) for example Methane, Ethanol, Bio-Diesel(s), and a variety of combustible Solid Matter, stored in tanks 97, 96 94, or in the case of the solid material, a storage 98.

The fluid solar products of the biomass are directed, from their respective tanks, separately, sequentially or in combinations thereof selected by the facility operator into the gas turbine for combustion thereof and the generation of energy for generation of electricity therewith. The combined Cycle gas turbine—generator 24 system is controlled by a combustion control system 23, which controls the gas turbine 24 by controlling the fuel feed rate and air (or other carrier gas) feed rates, as well as controls all of the valves, etc. in the system. Either the solar feedstocks or a fossil fuel feedstock such as natural gas, stored in tank 99, are selectively supplied to the gas turbine 24. Essentially, the control system 23 monitors the grid 9 requirements or acceptance criteria for electricity from the facility, the power output in electricity from the system, the fluid and gas flow rates, and controls various control valving as known in the art to obtain the output from the gas turbine 24 necessary to obtain a desired immediate or nearly immediate output from the generator 25, it being understood that there is a lag time in obtaining a desired output.

The mixing valve is ported to the turbine 24; to deliver biomass based fuel, combinations of biomass and other fuels, or simply other fuels, such as fossil fuels, directly to the gas turbine 24 for combustion. The gas turbine 24 drives an electricity generator 25, supplying the power to the grid 9. The waste heat from the gas turbine flows into the Heat Recovery Steam Generator 26. Within the Heat Recovery Steam Generator 26, there is an array of multiple water vaporizers (usually 3 stages). These water vaporizers generate steam in a variety of temperatures, from high temp, super-heated to relatively low temp saturated steam. This steam is flowing to the various inputs of the Steam Turbine, (also usually 3 inputs.). The steam turbine 27 drives a generator 28, supplying the power to the grid 9. A water cooled condenser 29, is condensing the exhausted steam and turning it into water which is re-circulated to the Heat Recovery Steam Generator 26, by water pump 30. The water used for cooling the condenser is being chilled by a cooling tower 31. The waste gas from the Gas Turbine 24, after passing through all the vaporizers within the "Heat recovery steam generator" enters the exhaust divider 32, where the majority of the exhausted gases are being diverted and fed back to the Bio-Reactors 2 in solar field 1. A certain percentage of the exhaust gases are being released to the atmosphere through Stack 33.

The generating facility of FIG. 5 may also be operated in a reduced or "Zero" Emissions mode, mainly preventing the formation of Nitrogen Oxides (NOx). To enable this feature, in this aspect, air used as a carrier gas through the gas turbine 24 is replaced with inert Argon. To provide the Argon, a VPSA unit 10 is employed and the recovered argon is stored in tank 21. Thence the Argon gas is supplied to the gas turbine instead of atmospheric air passing through the Air Cooler 101. In the air cooler 101, liquid ice is produced and during the summer (On-Peak) months the Argon gas is cooled before being fed to the Gas Turbine. By cooling the Argon Gas, the total output capacity of the Gas Turbine is boosted.

Since Argon is a noble gas, it does not react with any of the combustion components, therefore it can be separated ("cleaned") by the gas separator 42 downstream of the heat recovery steam generator 26, and fed back to the gas turbine 24 via Air Cooler 101. Some of the Argon gas is separated within the Bio-Reactors, simply by bubbling it through the solution and due to the fact that the other components of the exhausted gases, such as $CO_2$ and $H_2O$ are actually nutrients consumed during the algae growth, and therefore will be automatically removed by the algae growth. The Argon gas after being separated will also be re-directed back to the Gas Turbine 24 via Air Cooler 101. A trace NOx cleaner 102 is placed between the exhaust of turbine 24, and the Heat Recovery Steam Generator 26. This $NO_x$ cleaner is required to ensure that any residual amount of Nitrogen which is normally supplied as a nutrient to the Bio-Reactors, and that may escape and enter the Gas Turbine, thus emitting harmful $NO_x$, will be eliminated, thus the generating facility can maintain a "Zero Emission" level status. Since atmospheric air is not used, the Oxygen needed for combustion is derived from the Bio-Reactors where it is a By-Product of the process of algae growing.

While the Argon gas is being separated from the exhaust gases and re-circulated back to the intake of the gas turbine, the other combustion products such as $CO_2$ and $H_2O$ are re circulated back to the Bio-Reactors where they are used as nutrients, and in return $O_2$ is produced. This $O_2$ is needed as the Oxidizer to combust the "Solar Fuel" products, so an endless closed loop of fuel, supplied with energy solely from the sun, may be established. However, it is specifically contemplated that some materials, such as Nitrogen, will need to be provided in supplemental quantities to the bioreactors, to maintain adequate growth of the biomass, and that Argon may need to be supplemented from the VPSA as leaks of argon may occur It is anticipated that the production of $O_2$ will be in large excess of the quantity needed to oxidize the fuel. The extra Oxygen will be stored in tank 20, and later be directed to the bottling/filling station 8. This station will be a separate profit center and will sell oxygen to the various industries.

The solar field can be further increased beyond the necessary size required to supply sufficient fuel to the turbine. In this case the required consumption of $CO_2$ will be larger than the amount of $CO_2$ is exhausted. The balance $CO_2$ may be acquired from other electrical generators, and may come with a fee paid to the solar generating facility for the disposal thereof other than to the atmosphere.

The embodiment of FIG. 5 also enables a closed fuel cycle (open only to solar insolation). In this embodiment Nitrogen ($N_2$), is being produced from atmospheric air using the Nitrogen Separator 87. Carbon Dioxide ($CO_2$), and Water ($H_2O$) are the main nutrients supplied to the Bio-Reactor 82 and initially are supplemented from an outside source. When irradiated by a certain spectrum of the solar radiation, the algae flowing in the said Bio-Reactors 82 and pumped by the pump 83, undergoes a process of reproduction, multiplication and conversion into a Solar Fuel. The Solar Fuel is stored in buffer tank 4 and then pumped to the refinery 15 where it is refined into high calorific fuels, such as Bio Diesel 14, Methane 17, Ethanol 16, etc.

During the Biological process (which is in close resemblance to the Photosynthesis process in green plants), Oxygen ($O_2$), is released as a By-Product and temporarily stored in tank 20. This oxygen may be used to supplement or provide oxygen for combustion in the Gas Turbine 24 for combusting the fuel produced by the Bio Reactor. During the combustion process in the Gas Turbine, water ($H_2O$) and $CO_2$ are being produced and exhausted. These gases are collected, "cleaned" and immediately recycled back to the Bio reactor where (as mentioned above) they are being used as the part of the nutrients (fuels) to grow the algae. The control of the entire power plant is managed by an "Intelligent Control System" 35.

Figure 6:
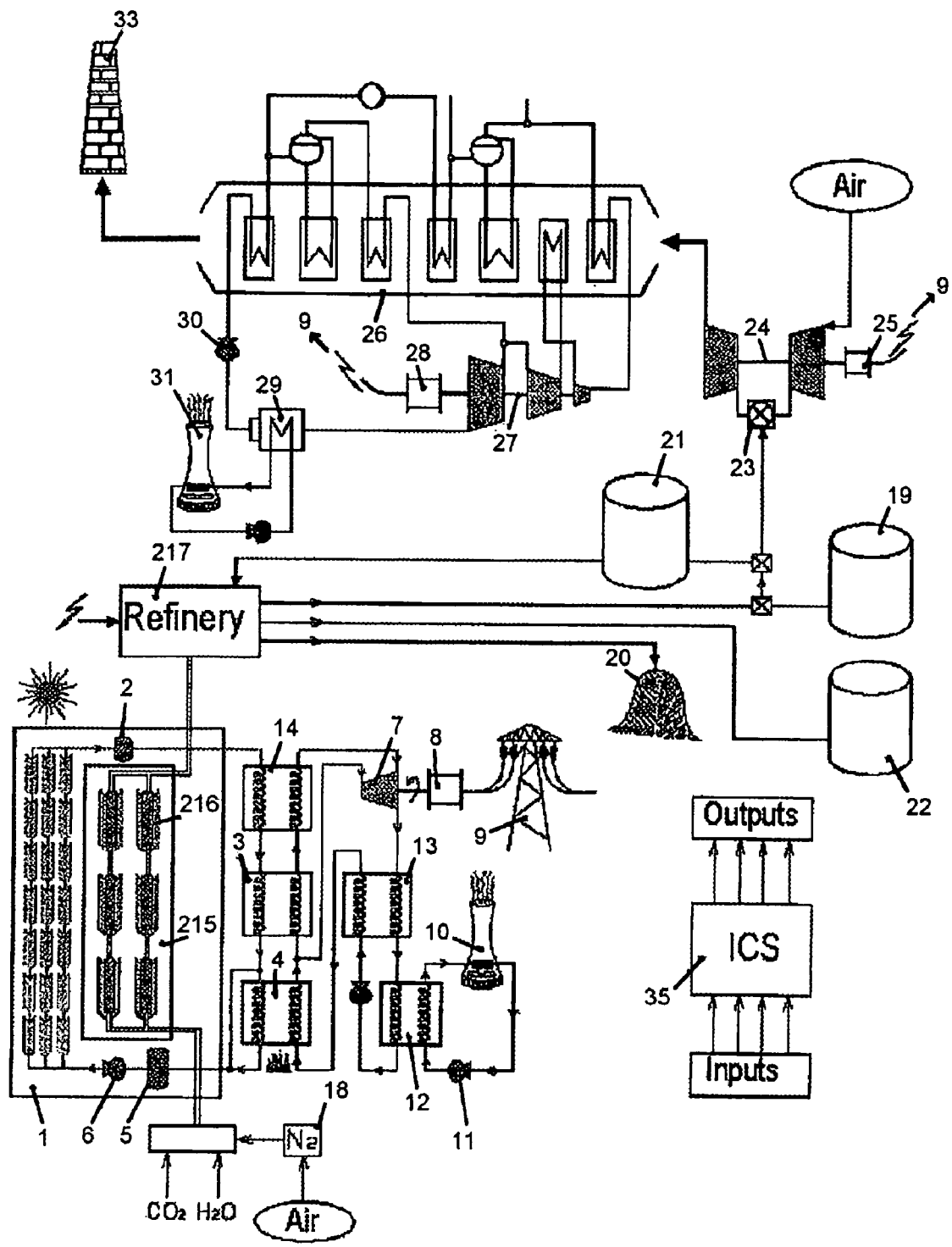
FIG. 6 is a schematic view of an additional aspect of the hybrid generating facility.

Referring now to FIG. 6, there is shown a further aspect of growing solar fuel in conjunction with hybrid electrical generation. In contrast to the aspect of FIG. 5, wherein only the growth of biomass is described, the hybrid generator of FIG. 6 includes both a solar field for directly generating electricity through the boiling of water into steam using incident insolation, and simultaneously growing a biomass in an area adjacent to, or overlapped with, the solar field, but does not include a system for recovering the byproducts of combustion as is described and shown with respect to FIG. 5. Referring to FIG. 6, a SEGS style generating facility as shown in FIG. 1 is modified in contrast to the system shown and described with respect to FIG. 5 to include a field 215, of "Solar Bio-Reactor Units" 216, (such as, but not limited to the Bio-Reactor described in U.S. Pat. No. 5,958,761 which field 215 is located, in this aspect, adjacent to a field of SCAs. Algae are grown in the bio-reactor 216, from which algal oils or other such fuels may be refined in refinery 217. The output of the refinery 217 can be (but is not limited to) methanol, ethanol, bio-diesels and a variety of combustible solid matter which can be stored, in the case of fluid products, in tanks 19, 21 and 22, or simply piled into a storage such as would coal in a traditional fossil fuel generation system. Simultaneously with the production of biomass in or adjacent to the solar field 1, heat absorbed from insolation on the solar field is, as described with respect to FIG. 1, such that steam so generated is expanded through a steam turbine 7 to drive a generator 8 to generate electricity for passage onto the grid 9. Alternatively, the electricity so generated may be used to process the algae or other biomass in the refinery 217, or may be used to generate hydrogen and oxygen as described previously herein.

Figure 7:
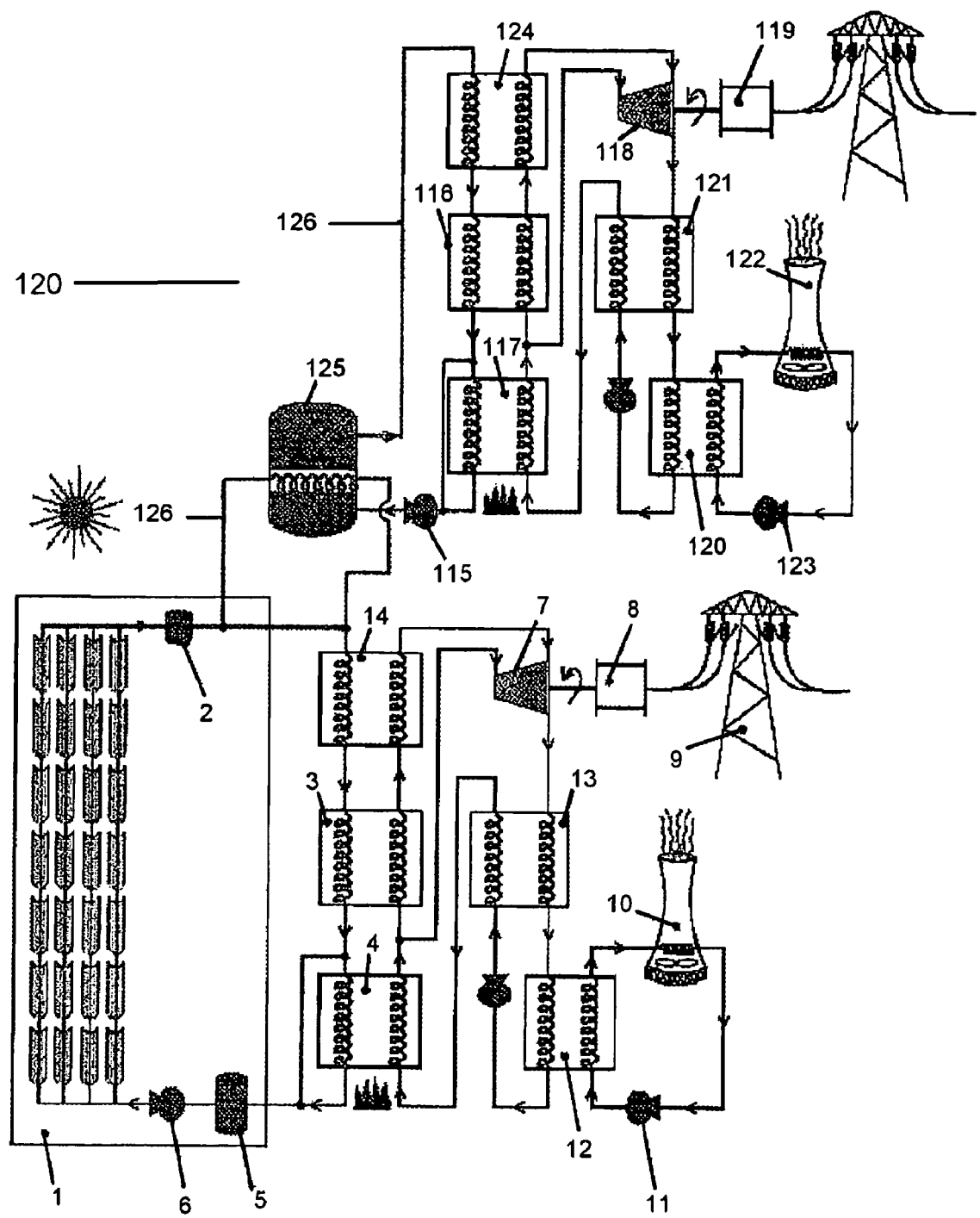
FIG. 7 is a schematic view of an additional aspect of a hybrid generating facility; and, FIG. 8 is yet an additional aspect of the apparatus for separating the solar radiation spectrum of FIG. 4.

Referring now to FIG. 7, there is shown an additional embodiment of the invention. In this embodiment, a power generation facility having a solar field 1 and generation system primarily as discussed in the Background section hereof is shown. As discussed herein, the first, solar powered generating facility includes the solar field, through which a heat exchanging fluid is flowed to heated by incident insolation, a heat exchanging section 14 through which water is flowed, through one side of a series of heat exchangers, to receive heat from the heat exchanging fluid flowing through the other side of the heat exchanger (for example, a shell and tube heat exchanger, etc.) a steam turbine section 7 through which the steam generated in the heat exchanging portion 14 is expanded to drive the blades of a steam turbine and thereby generate electricity from a generator 8 coupled thereto to deliver electricity to the grid, and a secondary cooling section 12 for cooling the water exiting the steam turbine.

However, in contrast to that previously described power generation system, in this embodiment there is provided a secondary, fossil fuel powered, generation system 120, interconnected to the solar system through a thermal peak storage buffer tank 125. Buffer tank 125 is sized to store at least sufficient heated heat transfer fluid to enable the production of an equivalent amount of energy as that produced by the second steam turbine 19 over a discrete period of time. Buffer tank 125 includes a valve (not shown) integrally formed therewith and coupled to a system controller (not shown) which is connected to a bypass pipe 126, which, when the valve is opened to flow heat transfer fluid therethrough, directs the heat transfer fluid to the fossil fuel generating 120 side of the system.

The fossil fuel generating system 120 includes a gas fired boiler 117, which heats the HTF which is pumped, by pump 115, to superheater 124 and thence through a heat exchanger 16, before returning in a loop to the boiler 117. Additionally, as part of the fluid loop, the heat exchanging fluid may be passed through the buffer tank, such as through tubes therethrough which enable the buffer tank to operate as a shell and tube type of heat exchanger), or, alternately, by being switched through an auxiliary line not shown to selectively pass the heat exchange fluid through heat exchange tubes in the tank 125. Water used to power the steam turbine 118 is passed, by a pump 126, through the boiler, thence through the heat exchanger to receive heat from the HTF and generate steam, and thence through the superheater 124 after which it enters the second stage of the steam turbine 116. A portion of the water exiting the boiler 117 is flowed to the first stage of the steam turbine. As a result, power is generated at the output of the steam turbine 116, which is converted to electricity by generator 119 and distributed to the grid. Additionally, the exit stream from the steam turbine 118 is flowed through a separator 121, and thence through a second heat exchanger 120 which is cooled by virtue of a secondary cooling loop, such as a cooling tower 122. The cooled water is thence passed through the cooling side of the separator 121 and thence back through the boiler 117. In this configuration, full output of the solar and the fossil fuel generators can be maintained.

To operate at full capacity in a solar only mode, solar energy is first stored in the buffer tank 125 by increasing the quantity and or temperature of the HTF fluid held therein. Then, the gas firing of the boiler 117 is ceased, and the valve is opened to allow the HTF which was heated solely by solar to be flowed through the fossil fuel generation side of the system while still operating the solar side at its full capacity.

It has been concluded by this invention that optimum economic use of the solar facility requires burning the natural gas in a manner counter intuitive manner, contrary to standard logic, as to the time and priority for gas burning. Contrary to standard burning procedures, the limited amount of natural gas available for burning under FERC regulations should be burned during peak solar insolation hours when normal logic says so much solar insolation is available. In the prior art not only is it not necessary to burn gas at this time, in fact it is necessary to turn off some of the solar field because the power block cannot absorb all the energy produced by the solar field because the solar field is purposely sized to provide more than full rated capacity. Interestingly, it happens to be the case that in desert climates in the most highly developed countries where the type of solar systems described in FIG. 1 work the best, the solar peak insolation coincides to the peak power needs because people are using their air conditioning. This peak air conditioner use time conforms to the Peak Energy use time of most electrical energy serving the desert based electric utility.

The solar facilities should be designed to deliver the added power during on peak hours by providing one channel of delivery that can deliver full power from gas and solar source power, and a second channel that is able to deliver an approximately equivalent amount of power principally from solar sourced power augmented when necessary by a gas heater. Thus during peak solar, peak need hours (On-Peak) the plants could produce approximately twice the power output; One channel producing the energy from natural gas burned on peak and the second channel producing approximately an equivalent amount of energy from principally almost purely solar sourced power.

The invention optimizes the size of the added turbine by determining the largest size of that turbine could be consistent with meeting the 25% maximum FERC gas burning requirements in the United States, and alternative statutory or related emission limits for solar plants that may exist in other countries.

While the above described gas burning is required by the invention and maximizes revenue by meeting customer need of providing two or more times the peak power during peak need, without the second part of the invention would not meet the FERC requirements of producing the full rated capacity of the plant from solar energy. As stated above in current designs solar fields are sized so that heat produced several hours before and several hours after peak solar insolation is sufficient to power the full rated capacity of the power block during that period. If the power block doubled in size, the solar field would not be of sufficient to power the doubling of capacity. To accommodate the FERC need to meet the full rated of the now double capacity or more of the SEGS plant an intermediate buffer storage unit which is used for accommodating solar insolation is modified in such a manner that it is able to also be used to serve as thermal storage source for producing high pressured steam to the second turbine during On-Peak utility demand and which occur during peak solar insolation hours. With the use of this minimal dual-purpose thermal storage for power for short times the second turbine and serving as a thermal buffer to stabilize solar fluctuations the SEGS is able to demonstrate that it is able to meet.

The increased capacity of the steam turbine described above-as being added by providing a second turbine of similar size could alternatively be increased in capacity by added by increasing to the primary turbine.

The invention thus provides greater peak power, with greater utilization of the solar portion, without increasing the solar field and size, and that designing and operating the plant in this manner increases the revenues of the plant by approximately 40%, while increasing the cost of construction of the plant by an order of 5% and has almost no effect on operating costs.

The ratio of the prior art solar field size to the rate capacity of the Power Block has been determined to be optimized based on many considerations over an 8 year period. The conclusion reached, which is maintained for purposes of this analysis is that the solar field should be sized to about 115% of that required, to allow the solar field alone to produce the rated capacity of the plant during times of full solar insolation. Thus during peak solar insolation, the Luz SEGS project operates only 85% of the SCA's in the field. Enlarging the field in this manner allows the solar field to provide all or most of the power during the On-Peak demand period from solar field only, during the non-peak solar insolation portions of the day without the use of gas burning. The enlarged solar field requires that approximately 15% of the field be turned down during peak insolation to prevent overpowering the power delivery system (Power Block) during these times.

Assuming that 4 hours per day, 15% of the solar field is turned down during the June-September On-Peak period, where the solar insolation is at it's peak as well, and further assume that the degree of "turn down" averages 7.5% of the full rated power capacity of the plant, then the potential added power that could be derived if the field were fully used would be 7.5%×4 hours or 30% of 1 full rated capacity hour.

There are 122 days during the "On-Peak" period from June 1-September 30, or the equivalent of 36.6 of solar sourced hours of full rate power delivery. The additional 36.6 hours of solar sourced power permits an additional 12.2 hours of gas burning. In the years of maximum On-Peak days 86/122×36.6 hours or 25.8 of these additional solar-sourced hours occur On-Peak.

The Thermal Peaking Storage-Thermal Buffering device is differentiated from and ordinary storage unit is several ways:

1) By size: the thermal storage unit is relatively small allowing the full capacity of the SEGS to be activated purely by solar means to satisfy statutory requirements of providing full rated solar and possibly certain emission modulation, while the primary power for the increase in capacity is provided by burning gas On-Peak (utility peak) and On-Solar Peak.
2) The Thermal Peaking Storage-Thermal Buffering device is small enough to be in-line with the solar field buffering solar input radiation fluctuation with clouds and other which is a much smaller requirement than that of traditional Storage for Thermal time shifting applications, which for many reasons is larger and for more convenient time management of use wants to be off-line, instead of on-line.
3) The Thermal Peaking Storage-Thermal Buffering device is equipped with a natural gas heater thus allowing the heating the HTF fluid in the absence of sunlight to be used to fully power the auxiliary (On-Peak) steam turbine.

In order to meet FERC requirements for capacity, the new solar field (having the two channels in parallel) must be able to power both turbines in parallel at their full rated capacity by solar energy only, and for a predetermined short time. In order to achieve that, the second turbine 18 is powered by the stored thermal energy, while at the same time the first turbine 7 is powered by the solar field only. Since the stored energy is (excess) solar energy as well, then the double output plant will meet FERC requirements.

The (mostly) gas burning channel has 512.2 MW of gas to burn plus 3.8 hours from the additional 25.8 solar sourced hours which is adequate to provide a full 516 hours On-Peak power for the (mostly) gas channel, leaving 22 additional solar sourced hours to power the solar source channel which is essentially power from solar only, with small amounts of solar input. Thus the proposed system is able to deliver essentially twice as much "On-Peak" power from the same size solar field.

Making up for minor short falls of gas, solar input will give full double capacity credit.

The above analysis shows that during maximum solar hour On-Peak years and with good sun there is adequate combined solar source energy and gas supplied energy to double On-Peak output, with the margin increase occurring during year in which July 4th and Labor Day happen to fall in the weekend, the On-Peak hours are reduced to a minimum of 504 hours.

In the event that there is a small inadequacy in combined solar insolation and gas reserve the difference can be made up in several ways as indicated below:

1) For reasons of providing buffering for cloud covering and for reasons of providing and ability to provide full solar source powering of the entire power station some thermal storage has historically and will continually be required. One half hour thermal storage if collected during On-Peak solar mornings and expended during On-Peak late days when needed could add somewhere on the order of 30-30 additional On-Peak solar sourced hours.
2) If the fiscal situation is such that interests rates are low and gas prices are temporarily high, and tax and other fiscal conditions exist for encouraging purchase of capital equipment, it may be economically worthwhile to increase the efficiency of the system by adding a low temperature heat recover system at the output of the steam turbine. This would increase the amount of On-Peak hours in proportion to the efficiency increase which may be on the order of 7.5%.
3) Lastly, the solar insolation gas burning margin could increase by reducing the output capacity gain from that of doubling the capacity or more to increasing the output capacity by a lesser amount which would be set by the maximum rate providing adequate solar insolation-gas burning availability comfort.

Brief Economic Effects Summary

The burning of gas during On-Peak would increase and other means would effectively shift power from mostly Mid-Peak to On-Peak with the possibility of a small amount shifted from Off-Speak to On-Peak.

For a 100 MW project where 100 MW is shifted from Mid-Peak to On-Peak, at prevailing quoted On-Peak at an average price of $178/MWhr and the Summer Mid-Peak value of $56/MW. The resultant economic gain for each MW shifted is equal to approximately $122/MW and the ability to create an additional 25 MW On-Peak hours at $178/MW. The resultant value of the change is:

$$(510-25) \times 100 \times \$122 + 25 \times 100 \times \$178 = \$6,362,000/\text{Year.}$$

It will be evident to those skilled in the art that the invention is not limited to the details of the foregoing illustrated embodiments, and that the present invention may be embodied in other specific forms without departing from the spirit or essential attributes thereof. The present embodiments are therefore to be considered in all respect as illustrative and not restrictive, the scope of the invention being indicated by the appended claims rather than by the foregoing description, and all changes which come within the meaning and range of equivalency of the claims are therefore intended to be embraced therein.

It will be evident to those skilled in the art that the invention is not limited to the details of the foregoing illustrated embodiments, and that the present invention may be embodied in other specific forms without departing from the spirit or essential attributes thereof. The present embodiments are therefore to be considered in all respect as illustrative and not restrictive, the scope of the invention being indicated by the appended claims rather than by the foregoing description, and all changes which come within the meaning and range of equivalency of the claims are therefore intended to be embraced therein.

I claim:

1. A method of generating electricity, comprising:
   providing a solar facility having at least one apparatus therein for generating electricity from solar insolation and at least one apparatus therein for generating a solar fuel therewith;
   providing a non-solar fuel based generating facility adjacent to said solar fuel facility and including therewith at least one gas turbine engine-generator set configured to generate electricity;
   producing, with said solar facility, electricity while releasing it to the power grid and solar fuel; and
   powering said non-solar based generating facility, at least in part, with said solar fuel, thereby generating electricity, and releasing the electricity generated thereby to the grid.

2. The method of claim 1, wherein the non-solar generating facility includes at least one gas turbine coupled to at least one generator for producing electricity therein.

3. The method of claim 2, wherein said solar fuel is oxygen or hydrogen.

4. The method of claim 2, further including the steps of:
   providing argon
   mixing the argon with a fuel and an oxidizer; and
   flowing the mixture of argon, fuel and oxidizer to the non-solar facility and combusting the fuel within a gas turbine engine in the gas turbine facility.

5. The method of claim 2, further including the steps of providing as a portion of the solar apparatus a solar field for converting solar insolation into heat energy in a heat transfer media;
   transferring at least a portion of the heat energy in the heat transfer fluid (HTF) into water to heat the water to steam;
   providing at least one steam turbine coupled to at least one generator,
   passing the so generated steam through the steam turbine and converting the heat energy transferred into the steam from the HTF into an output energy of the steam turbine useful to drive a generator;
   generating electricity with the generator;
   providing a fuel cell and a supply of water thereto; and
   directing at least a portion of the electricity generated by the generator to the fuel cell, and driving the fuel cell to produce hydrogen and oxygen from the water in the fuel cell.

6. The method of claim 5, wherein at least one of the hydrogen or oxygen is stored for use in the gas turbine generating facility.

7. The method of claim 2, further including the steps of:
   generating a solar fuel; storing the solar fuel; and thereafter
   simultaneously generating electricity using both the solar fuel and a fossil fuel.

8. The method of claim 2, further including a heat recovery.

9. The method of claim 1, further including the steps of:
   providing a solar field and capturing energy from solar insolation in the solar field; transferring the captured energy as a solar fuel to at least one of a solar electrical generator system including a steam turbine therein or a storage;
   providing a fossil fuel fired generating facility operatively coupled to, and selectively powered by, fossil fuel or solar energy provided from the storage; and
   producing electrical energy from incident solar insolation by transferring such energy to the solar electrical generating system and simultaneously generating electrical energy in the fossil fuel fired generating facility from solar energy in the storage.

10. An apparatus for producing electricity, comprising:
a solar facility having a solar generator for generating and storing solar energy in the form of fuel;
a combustion based generating facility, coupled to said solar fuel generator, to use energy from said solar energy in the form of fuel to produce electricity therewith, said combustion based generating facility, at times, producing electricity solely from said solar energy in the form of fuel and transmitting said electricity over the grid.

11. An apparatus for producing electricity, comprising:
a solar facility having a solar generator for storing solar energy in tangible form;
a combustion based generating facility, coupled to said solar fuel generator, to use energy from said solar energy stored in tangible form to produce electricity therewith, said combustion based generating facility, at times, producing electricity solely from said solar energy stored in tangible form and transmitting said electricity over the grid
wherein said solar generator includes:
a solar field for capturing heat energy from solar insolation;
a steam turbine operatively coupled to the solar field and configured to generate electricity from heat energy captured from the solar field;
a fuel cell coupled to a source of water and to the electrical output of said solar generator, said fuel cell drivable to generate oxygen and hydrogen from water; and
a storage for storing at least one of said hydrogen or oxygen for use in said combustion based generating facility, the tangible form including the hydrogen.

12. An apparatus for producing electricity, comprising:
a solar facility having:
  a solar generator for storing solar energy as hydrogen;
  a combustion based generating facility, coupled to said solar generator, to use energy from said hydrogen to produce electricity therewith;
  a solar field for capturing heat energy from solar insolation;
  a steam turbine operatively coupled to the solar field and configured to generate electricity from heat energy from the solar field;
  a fuel cell coupled to a source of water and to an electrical output of said solar generator, said fuel cell drivable to generate oxygen and hydrogen from water;
  a storage for storing at least one of said hydrogen or oxygen for use in said combustion based generating facility; and
a controller coupled to said solar generator and said combustion based generating facility, wherein said controller selectively controls the solar generator to deliver electricity from the steam turbine to an electrical distribution grid or the fuel cell to create hydrogen and oxygen; and
said controller also being configured to pass hydrogen stored from prior operation of the solar generator to fuel to said combustion based generating facility and thereby generate and supply electricity to the grid while simultaneously causing the solar generating facility to generate electricity directly from incident solar energy captured in the solar field and directed to the steam turbine in the solar generating facility.

13. The apparatus of claim 12, wherein said solar generator includes: at least one bio-reactor capable of growing a biomass therewith.

14. The apparatus of claim 13, wherein said solar generator includes: at least a second bio-reactor capable of growing a biomass therewith other than the biomass growable in the at least one bio-reactor.

15. The apparatus of claim 13, further including a refinery for refining a fuel from said biomass for combustion in said combustion based generating facility;
a storage for storing said fuel;
a gas turbine provided in said combustion based generating facility and coupled to an electrical generator;
a carrier gas source coupled to said gas turbine, said gas turbine including an exhaust therewith;
a heat recovery heat exchanger coupled to said exhaust and configured to recover heat therefrom, said heat transferred therefrom for use in generating electricity in a steam turbine-generator, said exhaust passing through the heat exchanger to an exhaust;
an extractor coupled to said exhaust for recovery of at least one product of combustion from said gas turbine;
a steam turbine operatively coupled to the solar field and configured to generate electricity from heat energy captured from the solar field;
a fuel cell coupled to a source of water and to the electrical output of said solar generator, said fuel cell drivable to generate oxygen and hydrogen from water; and
a storage for storing at least one of said hydrogen or oxygen for use in said combustion based generating facility.

16. A method of generating electricity, comprising:
providing solar facilities having at least one apparatus for generating electricity from solar insolation and at least one apparatus for generating a solar fuel therewith;
providing a non-solar fuel based generating facility and including therewith at least one electricity generating mechanism;
producing, with said solar facility, both electricity for release to a power grid and solar fuel; and
powering the non-solar based generating facility, at least in part, with said solar fuel simultaneously with non-solar fuel to generate electricity and release it to the power grid during at least one of periods of peak electricity demand and non-peak electricity demand, and powering the non-solar generating facility solely with non-solar fuel to generate electricity and release it to the power grid during the other of the period of peak electricity demand or non-peak electricity demand.

17. The method of claim 16, wherein the electrical generating mechanism is a gas turbine.

18. The method of claim 16, wherein the solar fuel is hydrogen.

19. The method of claim 17, wherein the hydrogen is generated from a fuel cell.

20. The method of claim 17, further including the steps of providing argon
mixing the argon with a fuel and an oxidizer; and
flowing the mixture of argon, fuel and oxidizer to the non-solar facility and combusting the fuel within the gas turbine engine in the gas turbine facility.

21. The method of claim 20, wherein the exhaust of the gas turbine, at least in part, is separated into multiple components, and the argon in the exhaust is recycled.

22. The method of claim 16, wherein the solar fuel is used solely during periods of peak electrical demand.

23. A method of generating electricity, comprising:
providing a fixed land-based solar facility with a capacity of at least 100 MW having an apparatus therein configured to generate electricity from solar insolation and an apparatus therein configured to generate a solar fuel;
providing a generating facility configured to generate electricity from fuel;
at first times, converting the solar energy received by the solar facility to electricity while releasing the electricity to the power distribution grid;
at second times, converting a first part of the solar energy received by the solar facility to second electricity while releasing the electricity to the power distribution grid and simultaneously converting a remainder of the solar energy received by the solar facility to solar-derived fuel and storing it; and
at third times, converting the solar energy received by the solar facility and solar-derived fuel to electricity, using the solar facility and the generating facility, while simultaneously releasing the electricity to the power distribution grid.

24. The method of claim 23, wherein the solar-derived fuel includes hydrogen.

25. The method of claim 23, further comprising at fourth times converting the solar energy received by the solar facility, solar-derived fuel, and a fossil fuel to electricity, using the solar facility and the generating facility, while simultaneously releasing the electricity to the power distribution grid.

26. The method of claim 23, further comprising, wherein the converting the remainder of the solar energy to solar-derived fuel includes storing oxygen and the converting the solar-derived fuel includes burning a mixture of hydrogen and argon using the oxygen resulting from the storing oxidizer, producing oxygen as a product.

27. The method of claim 23, further comprising, at fourth times converting the solar energy received by the solar facility, solar-derived fuel, and a natural gas to electricity, using the solar facility and the generating facility, while simultaneously releasing the electricity to the power distribution grid, the converting including automatically selecting and mixing selected ratios of natural gas and hydrogen using a mixing valve.

28. An apparatus for producing electricity, comprising:
a solar fuel generator configured to generate hydrogen and oxygen and store the same;
a combustion based-generating facility, coupled to the solar fuel generator, configured to convert at least the hydrogen into electricity;
a solar field for capturing heat energy from solar insolation;
a solar thermal facility configured to generate electricity from the heat energy;
a controller, coupled to the solar fuel generator and the combustion based generating facility, configured selectively to control the solar thermal facility to deliver electricity to an electrical distribution grid or to control the solar fuel generator to generate hydrogen and oxygen; and
the controller also being configured to pass hydrogen stored from prior operation of the solar fuel generator to the combustion based generating facility to generate electricity and supply it to the electrical supply grid while simultaneously using the solar thermal facility to generate electricity using thermal energy from the solar field and conveying the electricity to the electrical supply grid.

29. The apparatus of claim 28, wherein said solar generator includes: at least one bio-reactor capable of growing a biomass therewith.

30. The apparatus of claim 29, wherein said solar generator includes: at least a second bio-reactor capable of growing a biomass therewith other than the biomass capable of growing in the at least one bio-reactor.

* * * * *